(12) United States Patent
Scales et al.

(10) Patent No.: US 7,026,701 B2
(45) Date of Patent: Apr. 11, 2006

(54) SCHOTTKY BARRIER PHOTODETECTORS

(75) Inventors: Christine Ann Scales, Ottawa (CA); Pierre Simon Joseph Berini, Ottawa (CA)

(73) Assignee: Spectalis Corp., Nepean (CA)

( * ) Notice: Subject to any disclaimer, the term of this patent is extended or adjusted under 35 U.S.C. 154(b) by 0 days.

(21) Appl. No.: 10/791,855

(22) Filed: Mar. 4, 2004

(65) Prior Publication Data

US 2004/0173865 A1  Sep. 9, 2004

Related U.S. Application Data

(60) Provisional application No. 60/451,257, filed on Mar. 4, 2003.

(51) Int. Cl.
*H01L 31/00* (2006.01)
(52) U.S. Cl. ............... 257/449; 385/2; 385/15; 359/34
(58) Field of Classification Search ............... 257/449; 438/31; 385/2, 15, 16, 31, 39, 129–132; 359/34
See application file for complete search history.

(56) References Cited

U.S. PATENT DOCUMENTS

| | | | |
|---|---|---|---|
| 3,638,300 A * | 2/1972 | Foxhall et al. ............... | 257/480 |
| 4,394,571 A | 7/1983 | Jurisson ....................... | 250/216 |
| 4,531,055 A | 7/1985 | Shepard et al. ............. | 257/448 |
| 4,533,933 A | 8/1985 | Pellegrini et al. ........... | 257/455 |
| 4,544,939 A | 10/1985 | Kosonocky et al. ........ | 257/452 |
| 4,857,973 A | 8/1989 | Yang et al. .................. | 257/73 |
| 4,876,586 A | 10/1989 | Dyck et al. .................. | 257/451 |
| 4,908,686 A | 3/1990 | Maserjian .................... | 257/451 |
| 5,625,729 A | 4/1997 | Brown ......................... | 385/31 |

(Continued)

FOREIGN PATENT DOCUMENTS

GB  2 186 144  8/1987

OTHER PUBLICATIONS

Elabd et al. "Theory and Measurements of Photoresponse for Thin Film Pd2Si and PtSI Infrared Schottky-Barrier Detectors With Optical Cavity," RCA Review 43, pp. 569-589, 1982.

(Continued)

*Primary Examiner*—Douglas W Owens
(74) *Attorney, Agent, or Firm*—Thomas Adams (57) ABSTRACT

A Schottky barrier photodetector comprises a waveguide structure formed by a thin strip of material having a relatively high free charge carrier density, for example a conductor or certain classes of highly-doped semiconductor, surrounded by material having a relatively low free charge carrier density, the material on at least one side of the strip comprising a semiconductor, the strip having finite width and thickness with dimensions such that optical radiation couples to the strip and propagates along the length of the strip as a plasmon-polariton wave, light for detection being coupled to one end of the strip to propagate along the strip as said plasmon-polariton wave, ohmic contact means applied to the semiconductor material and at least one electrode means connected to the strip for applying bias to the Schottky barrier and extracting a photodetector current corresponding to the light applied to the photodetector. Where the strip of material is a flat, thin strip, the device will be polarisation dependent. Substantially polarisation-independent operation maybe achieved by using a strip whose width is of the same order as its thickness.

30 Claims, 7 Drawing Sheets

U.S. PATENT DOCUMENTS

| | | | |
|---|---|---|---|
| 5,648,297 A | 7/1997 | Lin et al. | 438/92 |
| 5,685,919 A | 11/1997 | Saito et al. | 136/259 |
| 5,977,718 A * | 11/1999 | Christensen | 315/169.1 |
| 6,178,275 B1 | 1/2001 | Nerses et al. | 385/14 |
| 6,442,321 B1 | 8/2002 | Berini | 385/130 |
| 2004/0081398 A1 | 4/2004 | Jette et al. | 385/37 |

OTHER PUBLICATIONS

Mercer et al. "A Diffusion Model for the Internal Photoresponse of PtSi/p-Si Schottky Barrier Diobes," J. Appl. Phys. 65 (12), Jun. 15, 1989, pp 5035-5042.

S. M. Sze, Physics of Semiconductor Devices, 2nd ed. Wiley, New York, 1981, p. 262 and 291-292.

Duboz et al. "Hot-electron Transport in Epitaxial CoSi2 Films," Physical Review B, Vol. 44, No. 15, Oct. 15, 1991, pp 8061-8067.

Wu et al. "Optical Properties of Epitaxial CoSi2/Si and CoSi2 Particles in Si from 0.062 to 2.76 eV," J. Appl. Phys. 71 (11), Jun. 1, 1992, pp5601-5605.

Quinn "Range of Excited Electrons in Metals," Physical Review vol. 126, No. 4, May 15, 1962, pp 1453-1457.

E. D. Palik, Handbook of Optical Constants of Solids, Academic Press, Inc., Orlando, 1985.

Charbonneau et al. "Experimental Observation of Plasmon-Politron Waves Supported by a Thin Metal Film of Finite Width," vol. 25, No. 11, 2000, Optics Letters, pp. 844-846.

* cited by examiner

FIG. 7B

SCHOTTKY BARRIER PHOTODETECTORS

CROSS-REFERENCE TO RELATED APPLICATION

This application claims priority from U.S. Provisional application No. 60/451,257 filed Mar. 4, 2003, the contents of which are incorporated herein by reference.

TECHNICAL FIELD

The invention relates generally to photodetectors, and more particularly to Schottky barrier photodetectors.

BACKGROUND ART

Semiconductor devices using metal-semiconductor barriers, known as Schottky barriers, instead of p/n junctions, have been developed to convert incident light into electrical energy. Silicon is often used as the semiconductor in Schottky barrier photodetectors for detecting in the infrared portion of the electromagnetic spectrum. Schottky barrier infrared photodetectors are well known in the art.

Examples of prior art Schottky barrier infrared photodetectors are disclosed in U.S. Pat. No. 4,531,055 to Shepperd Jr. et al and in U.S. Pat. No. 4,533,933 to Pellegrini et al. These prior art examples are planar devices in which the Schottky barrier photodetectors are comprised of a thin metal film, which could be a metal silicide film, on silicon. Normally incident light passes through the Schottky barrier once, which only absorbs a portion of the light leading to low external quantum efficiency levels.

To increase the absorption of the incident light, and hence, the external quantum efficiency, several solutions have been put forth. In U.S. Pat. No. 4,876,586, Dyck et al disclosed increasing the number of passes through the metal-semiconductor interface, and hence, the optical absorption, by selectively etching a 100 silicon wafer along the 111 planes to create a corrugated surface on which the metal was deposited. The corrugated surface, which is created in a similar manner as silicon V-grooves, increases the number of passes through the Schottky barrier through lateral diffraction of the incident light, In U.S. Pat. No. 4,394,571, Jurisson disclosed placing a mirror at a quarter wavelength from the metal-semiconductor interface to enhance the optical absorption of the device. He claimed that, at the design wavelength, most (about 95%) of the light will be absorbed. However, the absorption will not be uniform over a wavelength range, as has been noted by Elabd and Kosonocky in "Theory and Measurements of Photoresponse for Thin Film PdSi and PtSi Infrared Schottky-Barrier Detectors With Optical Cavity," RCA Review 43, pp. 569–589, 1982 and by Mercer and Helms in "A diffusion model for the internal photoresponse of PtSi/p-Si Schottky barrier diodes," J. Appl. Phys. 65 (12), 15 Jun. 1989. In each case, the authors reported that they investigated Schottky barrier photodetectors with an optical cavity created by a mirror over a range of wavelengths and found them to be wavelength dependent.

It is also possible to increase the optical absorption in a Schottky barrier photodetector by inducing a surface plasmon mode at the metal-semiconductor interface. This was achieved by refracting the incident light by a semicylindrical lens, according to U.S. Pat. No. 5,685,919 to Saito et al. In this case, increased absorption is only achieved at the correct angle of incidence of the light. According to U.S. Pat. No. 5,625,729 to Brown, coupling of the incident light to the surface plasmon mode was also achieved by use of a grating, which also requires the incident light to be at the correct angle. The angle of incidence required for both structures varies with the wavelength of the incident light, therefore at specific angles these devices will be narrow band detectors. To be broadband, they need to incorporate some kind of method of adjusting the incident angle of the light depending on its wavelength.

All of the above mentioned prior art require that the incident light be either normal or at a specific angle to the metal-semiconductor interface, making integration with optical fibers and other optical waveguides in an integrated optical circuit difficult. Yang et al in U.S. Pat. No. 4,857,973, propose a solution to this integration problem, They integrate a silicon channel waveguide with one or two Schottky barrier photodetectors. The Schottky devices are placed above and below the waveguide so that the "tail" region of the optical mode interacts with them and is absorbed. They claim that up to 70% of the incident light can be absorbed by these photodetectors. This is still not entirely satisfactory since at least 30% of the incident light is lost.

The contents of the above-mentioned technical articles and US patents are incorporated herein by reference, and the reader is directed to them for reference.

DISCLOSURE OF INVENTION

An object of the present invention is to overcome or at least mitigate the disadvantages of the prior art photodetectors, or at least provide an alternative.

According to the present invention, a Schottky barrier photodetector means comprises a waveguide structure formed by a strip of metallic material surrounded by material having a relatively low free charge carrier density, optical radiation for detection being coupled to one end of the strip, the strip having finite width and thickness with dimensions such that said optical radiation couples to the strip and propagates along the length of the strip as a plasmon-polariton wave, the surrounding material on at least one side of the strip comprising doped semiconductor material, a Schottky barrier being formed between said one side of the strip and the semiconductor material, the photodetector means further comprising means for applying bias to the Schottky barrier and extracting a current in dependence upon said optical radiation.

The applying and extracting means may comprise at least one ohmic contact applied to the semiconductor material, conveniently to one side thereof, and contact means connected to the strip. Such contact means may comprise at least one contact connected to the strip by at least one connector extending through the semiconductor material. Preferably, the contacts are optically non-invasive electrical contacts.

The at least one connector may comprise highly-doped semiconductor material doped oppositely as compared with the surrounding semiconductor material. Alternatively, the connector may comprise at least one core of conductive material extending through a hole in the surrounding material, the hole being lined by an insulating sleeve surrounding the core.

In either case, the contact means may further comprise a plurality of mutually-spaced contact fingers connecting the connector to the strip. An elongate contact portion extending substantially parallel to the waveguide strip may be included to interconnect the contact fingers and the at least one connector.

The material on the opposite side of the strip also may comprise a semiconductor material, thereby providing a second Schottky barrier at the interface therebetween. Indeed, the material on all four sides of the strip may comprise semiconductor material, such that there are four Schottky barrier interfaces between the four sides of the strip and the semiconductor material.

The width and thickness of the strip may be of the same order of magnitude, which may be especially advantageous when Schottky barriers are to be provided on all four sides of the strip. An advantage of the width and thickness being of the same order of magnitude is that the waveguide, and hence the photodetector, substantially polarization-insensitive.

In such a photodetector, the main long ranging plasmon polariton mode of the waveguide can be excited in the Schottky barrier photodetector by the endfire technique. The waveguide portion may be an endfire excited finite width metallic plasmon polariton waveguide as disclosed by Berini in U.S. Pat. No. 6,442,321 the contents of which are incorporated herein by reference, and to which the reader is directed for reference.

The waveguide strip itself is the metallic portion of the Schottky barrier, so the surface plasmon mode is excited directly at the interface between the semiconductor material and the strip, coincident with the Schottky barrier, thus providing improved high efficiency.

The metallic material may comprise a suitable metal, such as gold, copper, aluminum, silver, platinum, palladium, nickel, titanium, tungsten, molybdenum and chromium, or some other material having a suitably high free charge carrier density, for example a metal silicide if the semiconductor material is silicon or a metal germanide if the semiconductor material is germanium; or a combination of both if the semiconductor material is silicon-germanium. Alternatively, a semi-metal can be used, or a material that behaves like a metal, such as indium tin oxide (ITO).

The semiconductor material may comprise an elemental semiconductor material formed from elements of Column TV of the Mendeleev periodic table; or a compound semiconductor formed from elements of Column IV of the Mendeleev periodic table; or a compound semiconductor material formed from elements of Columns III and V of the Mendeleev periodic table; or a compound semiconductor material formed from elements of Columns II and VI of the Mendeleev periodic table.

Preferably, the semiconductor material is selected from the group consisting of silicon, germanium, silicon-germanium, silicon carbide, silicon germanium carbide, silicon germanium carbide tin, gallium arsenide, indium phosphide, gallium aluminum phosphide, gallium aluminum arsenide, gallium indium phosphide, gallium indium arsenide, gallium indium aluminum phosphide, gallium indium aluminum arsenide, gallium indium arsenide phosphide, and gallium aluminum arsenide phosphide.

When silicon is used as the semiconductor material, metal silicides, such as platinum-based suicides, palladium-based silicides, erbium-based silicides, iridium-based silicides, cobalt-based silicides and nickel-based suicides, can be used for the strip.

Preferably, the silicon photodetector is configured to detect signals having wavelengths in the range from 1.1 to 1.7 micron, but is not restricted to that range. Wavelengths within this range are preferred, however, because it encompasses communications wavelengths and, at those wavelengths, their energies are below the bandgap of silicon.

In some preferred embodiments, the semiconductor is a p-type material. It is, however, also possible to construct these photodetectors with an n-type material. The actual doping profile is not specifically described in this disclosure, as there are multiple possibilities which are described by the prior art. Preferably, higher doping is provided close to the ohmnic contacts to reduce resistance.

A dopant "spike", i.e., a highly doped thin layer, may be provided at the interface with the strip, its thickness and doping being controlled to adjust the height of the Schottky barrier and improve photodetector performance, The use of dopant "spikes" is disclosed in U.S. Pat. No. 4,554,939 to Kosonocky et al, in U.S. Pat. No. 4,908,686 to Maserjian, and in U.S. Pat. No. 5,648,297 to Lin et al, the contents of which are incorporated herein by reference, and to which the reader is directed for reference.

In some preferred embodiments, a reflector is provided at the end of the waveguide remote from the end from which the light for detection is coupled to the strip. Reflecting otherwise lost radiation back into the device increases absorption without increasing the Schottky barrier contact area, The reflector may comprise a Bragg grating or a highly-reflective coating on the end surface of the photodetector.

Preferred embodiments of the invention will now be described by way of example only and with reference to the attached drawings, in which like elements have been denoted throughout by like reference numerals in the different Figures.

DETAILED DESCRIPTION OF PREFERRED EMBODIMENTS

Figure 1A:
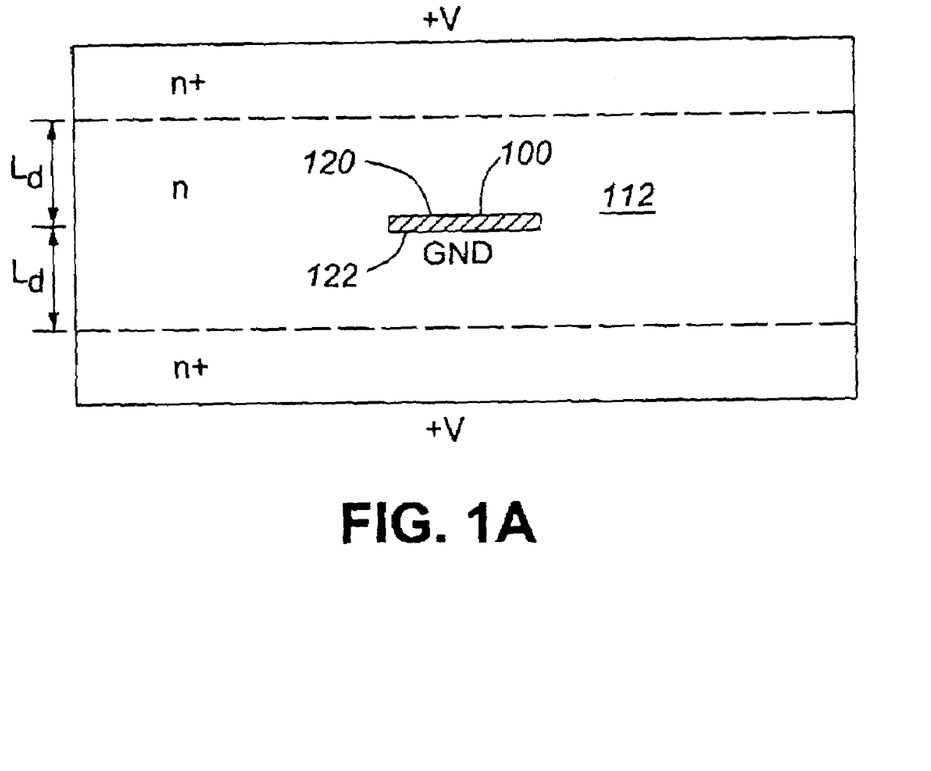
FIGS. 1A and 1B are cross-sectional views showing the basic structure of the waveguide/Schottky barrier metal strip without electrical contacts for different semiconductor types.
Figure 1B:
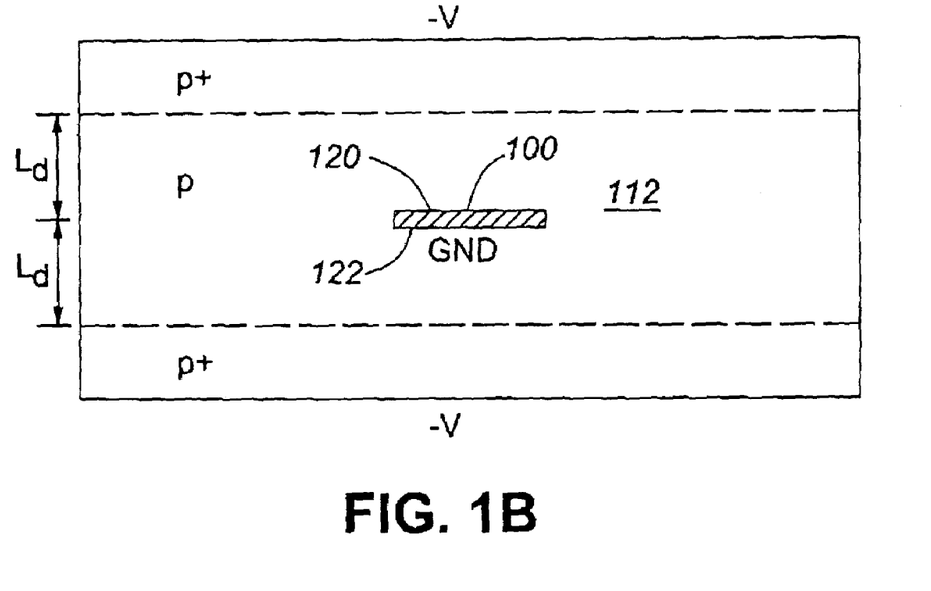

FIG. 1 shows the basic structure of a photodetector embodying the invention, without explicitly showing the electrical contacts. The basic structure of the invention is a finite width plasmon polariton waveguide 100 embedded in a semiconductor 112, forming a Schottky barrier photodetector. Two Schottky barriers are used in the detection of the signal, one on the top 120 and on the bottom 122 of the waveguide. The optical signal for detection, from a waveguide 140 (see FIGS. 3B and 5), will be endfire coupled into the waveguide 100, i.e., directed into the page in FIG. 1, and is shown in FIG. 4 as hv. Where the photodetector is part of an integrated optics circuit, for example, the waveguide 140 maybe apart of that circuit, and could comprise another plasmon-polariton waveguide structure. Where the photodetector is a discrete component, however, the waveguide 140 might be a "pigtail" of optical fiber packaged with the photodetector. It is envisaged that the waveguide 140 could be omitted and the optical radiation for detection coupled from free space in an endfire manner.

FIG. 1 indicates how to reverse bias the Schottky barrier in both doping cases. When an n-type dopant is used, reverse biasing is achieved by establishing a positive potential difference across the Schottky barrier, between the semiconductor 112 and the waveguide 100, as shown in FIG. 1A. When a p-type dopant is used, reverse bias is achieved by applying the opposite potential difference across the Schottky barrier, between the metal waveguide 100 and the semiconductor 112, as shown in FIG. 1B.

FIGS. 2, 3 and 4 show the photodetector with a suggested electrode configuration, which is by no means the only configuration possible within the scope of the present invention. The electrode configuration comprises two ohmic contacts to the semiconductor: one contact 110 on the bottom and the other contact 108 on the top. The bottom ohmic contact 110 runs the length and width of the device, whereas the top ohmic contact 108 runs the length of the device but is narrower in width than the device allowing room for the contacts to the waveguide 100.

The electrode configuration also comprises electrical contacts 102, 103, 104, 106 connecting to the waveguide 100 on either side. Electrical access to the waveguide is enabled through the contacts 106 on the top of the device, connected to contact portions 103 by vias 104, in the form of trenches running almost the length of the semiconductor body 112 but stopping short at each end. The contact portions 103 are connected to the waveguide 100 by contact fingers 102, as illustrated in FIGS. 2, 3B and 4. The electrical contacts to the waveguide comprise contacts/electrodes on the top of the device 106 which connect to contacts at the waveguide level 103 through vias 104. The contacts at the waveguide level 103 make contact to the waveguide 100 through optically non-invasive contact fingers 102. The optically non-invasive contact fingers have width, $w_f$, of the same order as the waveguide width, w, as shown in FIG. 3B, so as not to disrupt the plasmon polariton mode as it propagates along the waveguide. The contact finger length, $L_f$, is selected such that the contact portions 103 and vias 104 are positioned away from the plasmon polariton mode propagating along the waveguide 100. The thickness of the contact fingers 102 and the contact portions 103 can be less than or equal to the thickness of the waveguide 100.

Figure 2A:
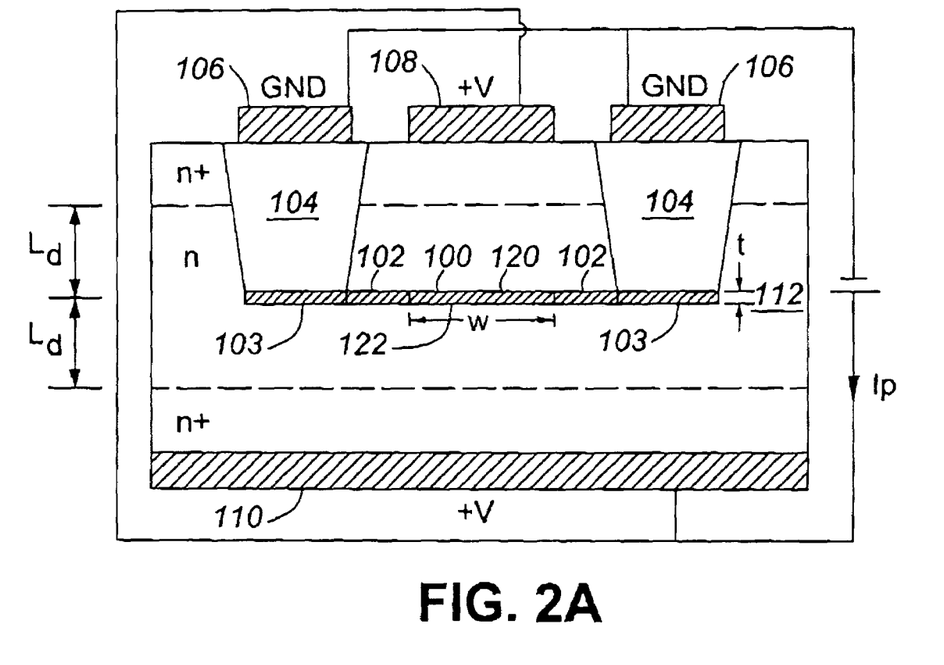
FIGS. 2A and 2B are a cross-sectional views of the photodetector.
Figure 2B:
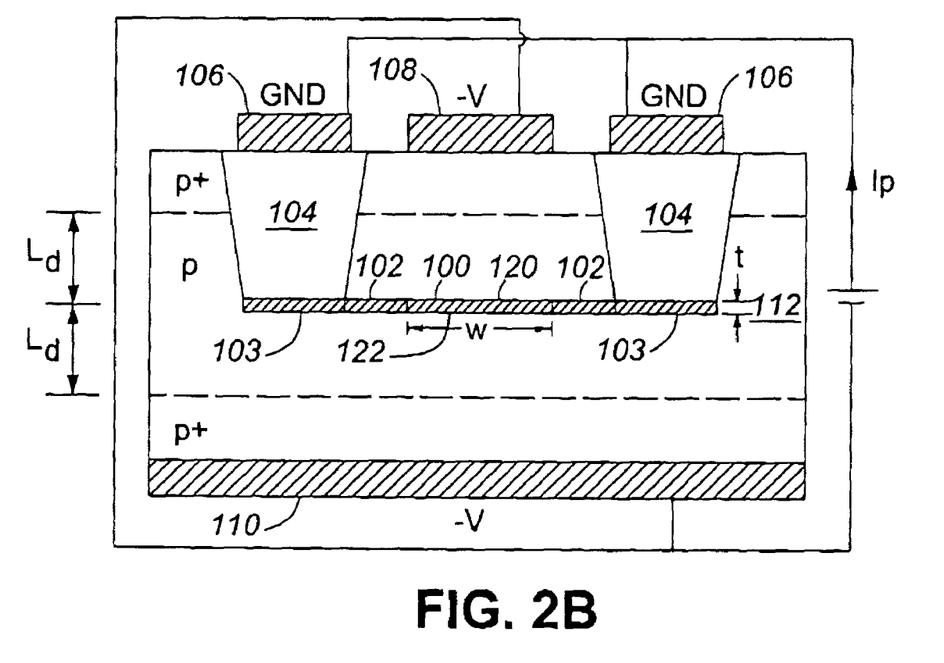
Figure 7A:
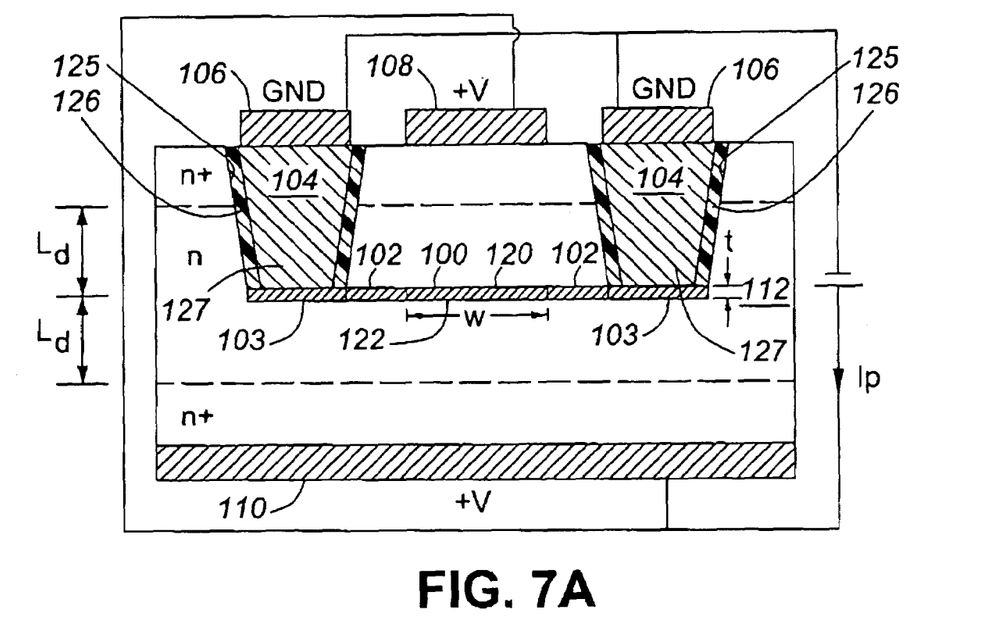
FIGS. 7A and 7B are cross-sectional views corresponding to FIGS. 2A and 2B but of a modified photodetector.
Figure 7B:
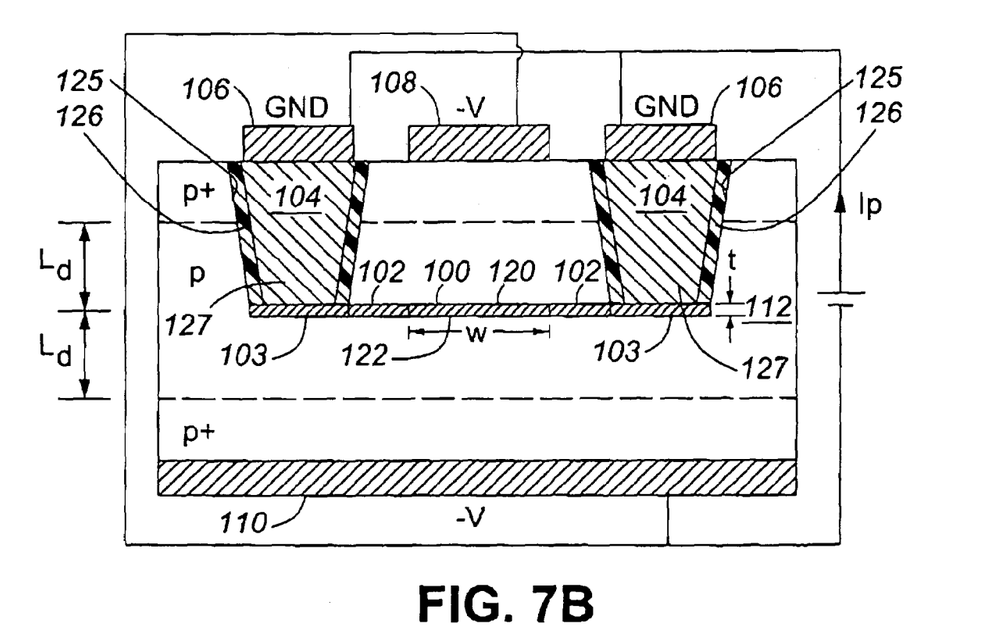

The vias 104 which connect contact portions 103 to contacts 106, could be, for example, oppositely-doped semiconductor material as shown in FIGS. 2A, 2B, and 4. Alternatively, as shown in FIGS. 7A and 7B, which illustrate a modified photodetector that otherwise is identical to that shown in FIGS. 2A and 2B, the connectors may be formed by trenches 125 that have a lining 126 of insulation on side and end surfaces and are filled with metal to form a metal connector 127.

Figure 3A:
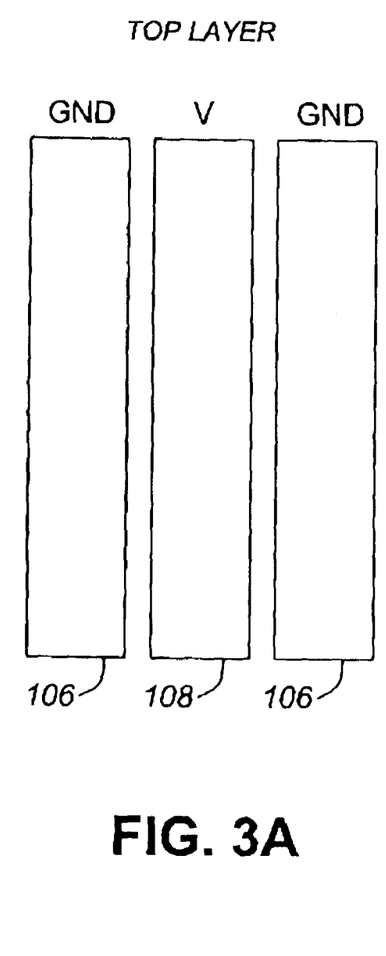
FIGS. 3A, 3B and 3C are plan views of top, middle and bottom metalization layers of the photodetector.
Figure 3B:
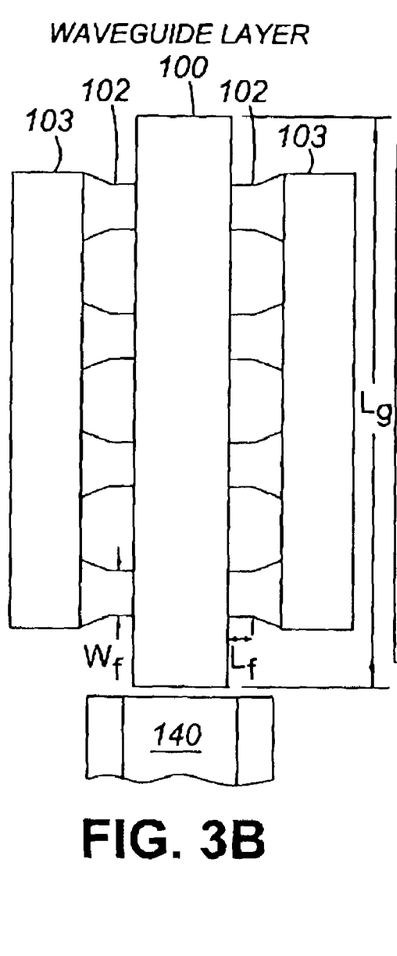
Figure 3C:
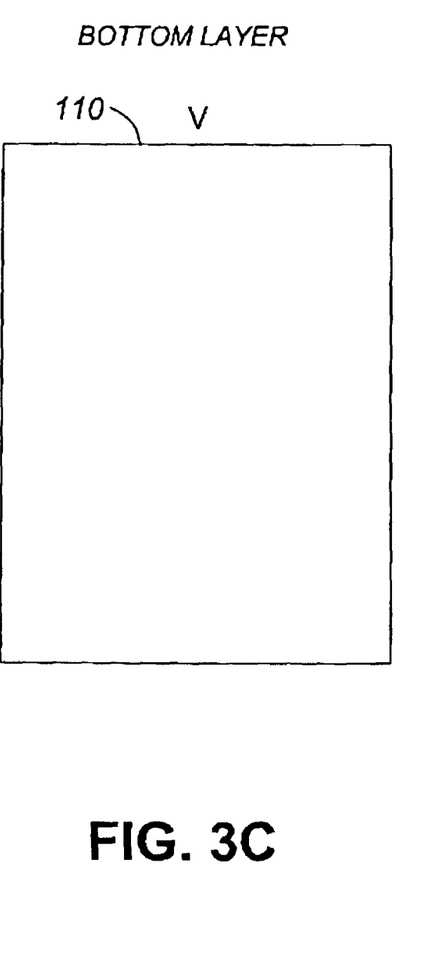
Figure 4:
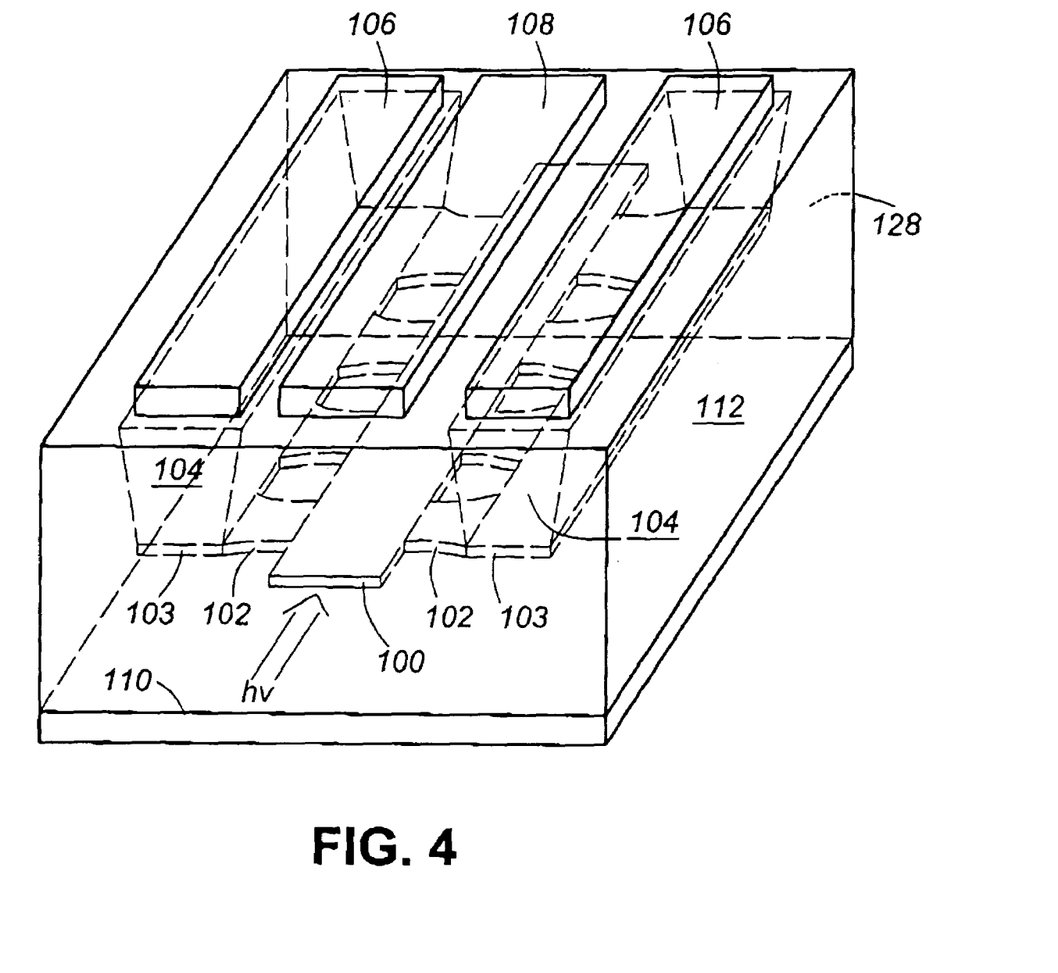
FIG. 4 is a schematic perspective view of a photodetector embodying the invention and showing a possible electrode configuration.

FIGS. 3A, 3B and 3C show the three different metalization layers of the device. The top layer, shown in FIG. 3A, comprises the contacts to the waveguide 106 and the ohmic contact to the semiconductor 108 that runs the length of the device. The waveguide layer, shown in FIG. 3B, comprises the waveguide 100 and the contacts to the waveguide 102 and 103. The contacts to the waveguide comprise contact portions 103 that run alongside the waveguide and contact fingers 102 that make contact to the waveguide. The bottom layer, shown in FIG. 3C, comprises an ohmic contact 10 to the semiconductor that runs the length and the width of the device.

FIG. 4 shows the relative position of the waveguide to the contacts 102, 103, 106, 108, 110 and vias 104. The ohmic contacts to the top 108 and bottom 110 of the semiconductor are used to bias both Schottky barrier contacts 120 and 122. Taking advantage of the double Schottky barrier interfaces in this manner doubles the surface area of the Schottky barrier contact and increases the responsivity of the photodetector. Of course, only one barrier could be used, if desired or necessary.

Figure 5:
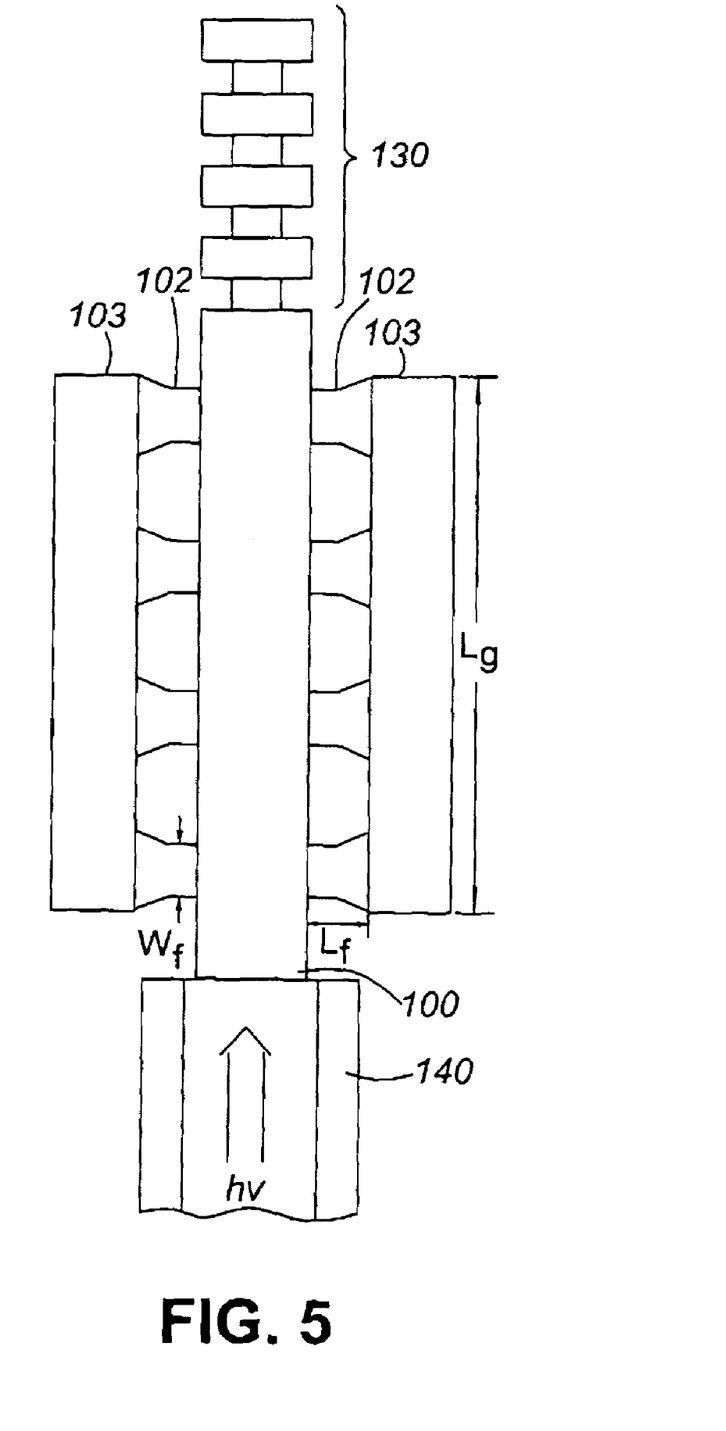
FIG. 5 illustrates a modification, specifically a middle waveguide metal layer of with a reflector at the output of the waveguide.

It is possible to further increase the responsivity of the device by introducing a reflector at the output of the waveguide. For example, as shown in FIG. 5, a Bragg grating may be used as-the reflector 130. The Bragg grating may be constructed using the same plasmon-polariton waveguide structure as the waveguide 100. The use of Bragg gratings in finite width plasmon polariton waveguides is disclosed by Jette et al in U.S. patent application Ser. No. 09/915,363 and International patent application PCT/CA01/01077 (WO 0210815). The reflector 130 would reflect otherwise lost radiation back into the device, thereby increasing the absorption and, hence, the responsivity without increasing the area of the Schottky barrier contacts. Since the dark current increases with the area of the Schottky barrier contact, keeping the area of the Schottky barrier constant keeps the dark current constant, Alternatively, in lieu of grating 130, a high reflection coating could be used to coat the back facet 128 of the detector.

As illustrated in FIGS. 1A and 1B, the type of doping used for the semiconductor can be either p-type or n-type. Metal-p-type semiconductor contacts typically have lower Schottky barrier heights which serve to increase the device responsivity but also increase the dark current, and hence, the minimum detectable power. Schottky barrier contacts that involve n-type semiconductors typically have higher Schottky barrier heights, and, therefore, have the opposite effect on responsivity, dark current, and minimum detectable power.

The doping profile is designed to improve device performance based on techniques known in the art. Typically, higher doping levels in the semiconductor material adjacent the ohmic contacts reduce resistance at the ohmic contacts. Thus, FIGS. 1A and 2A, for n-type material, and FIGS. 1D and 2B for p-type material, show the lower doping levels extending by a distance Ld each side of the strip 100.

A thin highly doped layer at the Schottky barrier interface has been used to improve detection and extend the wavelength range by reducing the Schottky barrier height. This technique is described in U, S. Pat. No. 4,554,939 to Kosonocky et al, in U.S. Pat. No. 4,908,686 to Masedian, and in U.S. Pat. No. 5,648,297 to Lin et al.

Also, it is envisaged that oppositely-doped regions may be provided along the length of the strip 100 at opposite edges of the strip, i.e., the edges connected to the contact fingers 102 (FIG. 4), to control the dark current (leakage) at those edges of the metal strip, again using known techniques.

The positions of the contacts and vias, the doping width $L_d$, the width of the contact fingers $w_f$, the number of contact fingers, and the period of the contact fingers determine the high speed characteristics of the photodetector. The contacts and vias need to be laid out and designed carefully to enable high speed operation by minimizing the parasitic resistance, capacitance and inductance of the photodetector. The number of contact fingers required should be minimised in order to be minimally optically invasive. The dimensions of the waveguide, the width, w, the thickness, t, and length, $L_g$, need to be designed carefully to achieve high responsivity and low dark current, and hence, low minimum detectable power.

Theory

To facilitate a proper understanding of how the photodetector operates and before the design of specific embodiments is described, the underlying theory, will be discussed.

Figure 6A:
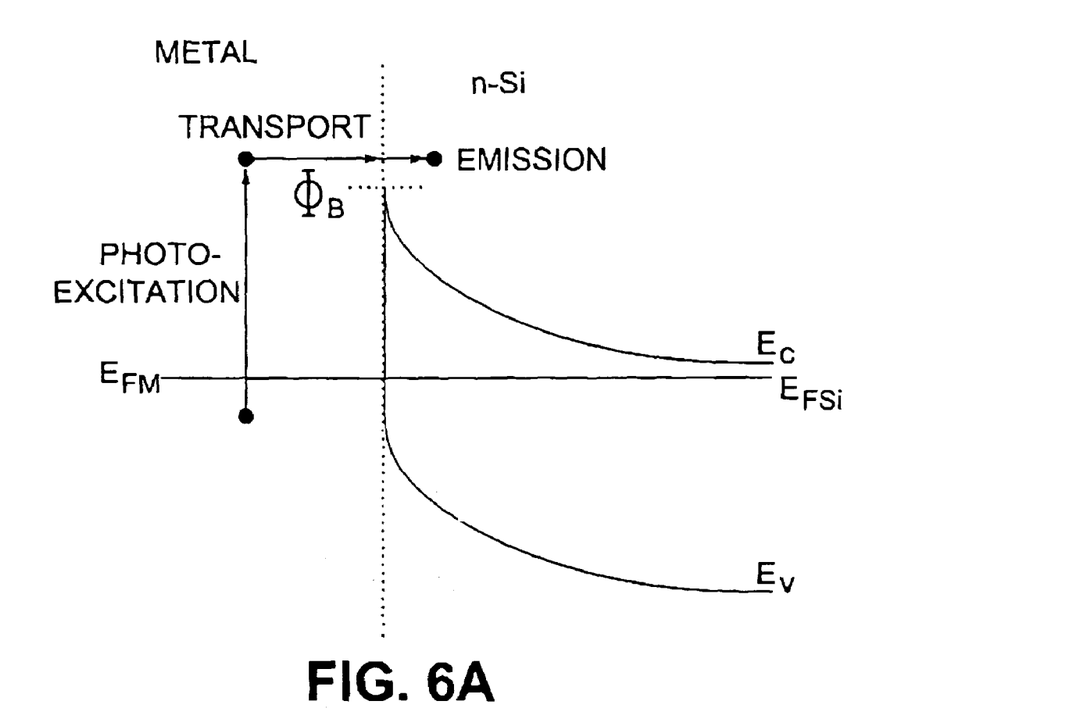
FIGS. 6A and 6B are band diagrams of a Schottky barrier on n-type and p-type silicon.
Figure 6B:
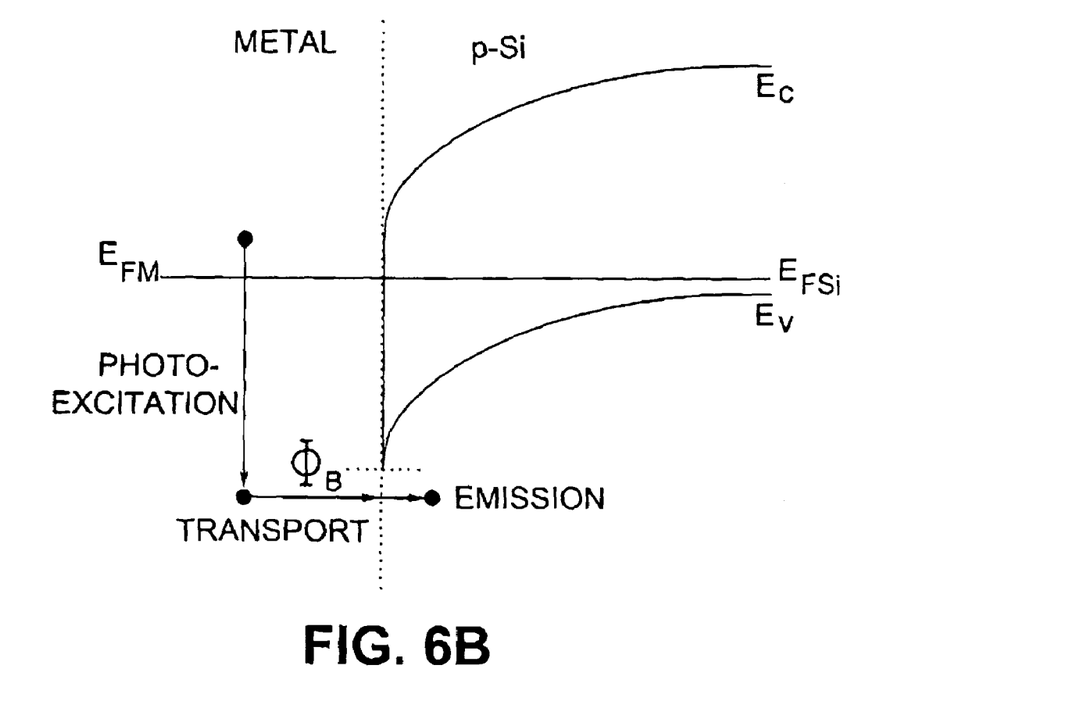

Light traveling along the waveguide 100 is attenuated by the waveguide 100 which forms Schottky barriers 120 and 122 with the semiconductor. Most of the attenuation is due to photons being absorbed by carriers in the metal waveguide 100. In the absorption process, the photon energy is transferred to the carriers. This is called photo-excitation. These photo-excited carriers thus gain enough energy to be emitted across the Schottky barrier, as holes in the p-doped case, shown in FIG. 6A, and electrons in the n-doped case, shown in FIG. 6B, and produce a current in the semiconductor. This current $I_p$ flows between the ohmic contacts 108/110 applied to (e.g. formed upon) the semiconductor material 112 and the contacts 106 by way of the path defined by contacts 102, 103, vias 104 and the waveguide 100. It should be appreciated that, if the vias 104 are wells of oppositely-doped semiconductor material, the contacts 106 also will be ohmic contacts.

The detection mechanism in embodiments of the present invention is the same as in prior art Schottky diodes; however, the internal quantum efficiency of Schottky barrier emission is increased in the thin film case due to an increase in the probability of emission of the photo-excited carriers. The internal quantum efficiency is usually defined in the following manner (H. Elabd and W. F. Kosonocky, "Theory and Measurements of Photoresponse for Thin Film Pd$_2$Si and PtSi Infrared Schottky-Barrier Detectors With Optical Cavity," RCA Review 43, pp. 569–589, 1982):

$$\eta_i = \frac{N}{N_T} \quad (1)$$

where $N_T$ is the total number of possible excited states from which a photo-excited carrier can be emitted over the barrier $\phi_B$. This is consistent with the analysis by Cohen et al in "Investigation of Semiconductor Schottky Barriers for Optical Detection and Cathodic Emission," Air Force Cambridge Research Labs. Report No. 68-0651, 1968, and is defined as $$N_T = \int_0^{h\nu} \frac{dN}{dE} dE \quad (2)$$

where hv is the energy of the radiation, $$\frac{dN}{dE}$$

is the density of states function, which is assumed to be constant over the range of integration, and N is the number of states from which carrier emission across the barrier $\phi_B$ may occur and is defined as $$N = \int_{\phi_B}^{h\nu} \frac{dN}{dE} P(E) dE \quad (3)$$

where P(E) is the probability of emission of the photo-excited carriers.

If the density of states function is assumed to be constant over the range of integration, combining equations (1), (2) and (3) yields the internal quantum efficiency:

$$\eta_i = \frac{1}{h\nu} \int_{\phi_B}^{h\nu} P(E) dE \quad (4)$$

In the thick film case, the probability of emission of photo-excited carriers is defined as (H. Elabd and W. F. Kosonocky, "Theory and Measurements of Photoresponse for Thin Film Pd$_2$Si and PtSi Infrared Schottky-Barrier Detectors With Optical Cavity," RCA Review 43, pp. 569–589, 1982)

$$P_{thick}(E) = \frac{1}{2}\left(1 - \sqrt{\frac{\phi_B}{E}}\right) \quad (5)$$

where E is the photo-excited carrier energy in eV, $E > \phi_B$.

From equation (5), the internal quantum efficiency in the thick film case becomes $$\eta_{i,thick} = \frac{1}{2}\left(1 - \sqrt{\frac{\phi_B}{h\nu}}\right)^2 \quad (6)$$

In the thin film case, with Schottky barrier interfaces on both sides, the probability of emission of photo-excited carriers is doubled due to the doubling of the interfaces and is further increased due to multiple carrier reflections within the film:

$$P(E) = P_0 + (1-P_0)[P_1 + (1-P_1)[P_2 + (1-P_2)[P_3 + \ldots + (1-P_{n-1})[P_n] \ldots ]]] \quad (7)$$

In the above probability equation, $P_0$ is the probability of emission at the initial energy level before any reflections have occurred, i.e. double the emission probability of the thick film case given in equation (5). $P_k$ is the probability of emission at energy level $E_k$: $P_k = P(E_k)$. $E_k$ is the energy of the photo-excited carriers after k reflections, $$n = \frac{L}{t}\ln\left(\frac{h\nu}{\phi_B}\right),$$

where $E_0$ is the initial energy hv. L is the attenuation length of photo-excited carriers, t is the metal thickness, and n is the number of reflections for radiation with energy hv, $$E_k = E_0 e^{-k\frac{t}{L}},$$

It can be seen that the internal quantum efficiency will increase with carrier reflections within the film. The number of carrier reflections depends on the ratio of the attenuation length of photo-excited carriers to the film thickness: L/t. The attenuation length of photo-excited carriers is a property of the metal (including its structure) used in the Schottky barrier. The greater the L/t ratio the more the internal quantum efficiency increases.

The external quantum efficiency is defined in terms of the internal quantum efficiency:

$$\eta = A\eta_1 \qquad (8)$$

where A is the absorption, $$A = \frac{S_{abs}}{S_{inc}},$$

where $S_{abs}$ is the absorbed power and $S_{inc}$ is the incident power.

The amount of power absorbed depends on the coupling efficiency and the absorption of the device:

$$A = \gamma_c A_{device} \qquad (9)$$

where $\gamma_c$ is the coupling coefficient.

The absorption of the device can be calculated from waveguide attenuation data. If $\alpha$ is the attenuation constant of the waveguide, the absorption of the device is the following:

$$A_{device} = 1 - e^{-\alpha L_S} \qquad (10)$$

where $L_S$ is the length of the waveguide.

The total absorption is therefore $$A = \gamma_c (1 - e^{-\alpha L_S}) \qquad (11)$$

Defined in terms of the external quantum efficiency, the responsivity is the following:

$$R = \frac{\eta}{h\nu} \qquad (12)$$

Defined in terms of the internal quantum efficiency, the responsivity is the following.

$$R = A\frac{\eta_1}{h\nu} \qquad (13)$$

where hν is in eV.

It should be noted that the responsivity depends upon the length of the Schottky barrier, the Schottky barrier height and the attenuation of the waveguide, which itself depends on the width and thickness of the waveguide metal. An explicit equation showing these relationships is given below for the thick film case:

$$R = \gamma_c (1 - e^{-\alpha L_g}) \frac{\left(1 - \sqrt{\frac{\phi_B}{h\nu}}\right)^2}{2h\nu} \qquad (14)$$

The responsivity is also defined as a measure of the photocurrent produced for a given incident optical power:

$$R = \frac{I_P}{S_{inc}} \qquad (15)$$

To be detected, the photocurrent must be greater than the dark current which is defined according to the thermionic emission-diffusion theory (S. M. Sze, *Physics of Semiconductor Devices*, 2$^{nd}$ ed. Wiley, New York, 1981, p262);

$$I_{dark} = wL_g A^{**} T^2 e^{-\frac{q\phi_g}{kT}} \qquad (16)$$

where $wL_g$ is the area of the Schottky contacts with w as the width of the waveguide and $L_g$ as the length of the waveguide, T is the temperature in Kelvin, k is Boltzmann's constant (1.38054×10$^{-23}$ J/K), q is the electron charge (1.60218×10$^{-19}$ C), and A** is the effective Richardson coefficient, which is 110 A/cm$^2$/K$^2$ for electrons in n-type silicon and 30 A/cm$^2$/K$^2$ holes in p-type silicon (S. M. Sze, *Physics of Semiconductor Devices*, 2$^{nd}$ ed., Wiley, New York, 1981, p262)

The minimum photocurrent that can be detected corresponds to the minimum incident optical power that can be detected. From the responsivity equation (15), the minimum detectable power can be defined;

$$S_{min} = \frac{I_{min}}{R} \qquad (17)$$

where $S_{min}$ is the minimum detectable power and $I_{min}$ is the minimum detectable photocurrent which is defined as the lowest detectable current above the dark current. The minimum detectable photocurrent will be a function of the equipment used to measure the output current $L_p$ of the photodetector. For comparative purposes, the minimum detectable power can be defined as being larger than the power at tie dark current level:

$$S_{min} > \frac{I_{dark}}{R} \qquad (18)$$

Substituting the definition of the dark current from equation (16) into the minimum detectable power equation (18) yields $$S_{min} > \frac{wL_g A^{**} T^2 e^{-\frac{q\phi_g}{kT}}}{R} \qquad (19)$$

It can be seen from the previous equations, (14) in particular, that the responsivity decreases as the Schottky barrier height increases but increases as absorption increases, which itself increases as the length and width of the waveguide, which is the Schottky barrier, increases. It can also be seen from (16) that the dark current decreases as the Schottky barrier height increases and increases as the Schottky barrier area increases. The minimum detectable power increases as dark current increases and decreases as responsivity increases. Devices with high responsivity and low dark current, or equivalently low minimum detectable power, are typically desired, however, responsivity and dark current both decrease as the Schottky barrier height increases and both increase as the length of the Schottky barrier increases. Because of these conflicting design requirements, it is not clear which photodetector architectures will give the best performance characteristics without actually comparing the above equations to find the desired characteristics. For this reason, it was important to develop the theory for predicting the internal quantum efficiency of the present invention.

Specific-Examples of Preferred Embodiments

From the theory developed above, it is clear that both the Schottky barrier height and the Schottky barrier/waveguide dimensions affect the photodetector performance. The length and cross sectional area of the waveguide affect the absorption; the longer, wider and thicker the waveguide the greater the absorption of light in the metal layer. The surface area of the Schottky barrier contact affects the dark current of the detector; the larger the metal-semiconductor contact area the greater the dark current. The greater the dark current the higher the minimum detectable power. Just as the waveguide dimensions have conflicting effects on the photodetector performance so does the Schottky barrier height. The lower the Schottky barrier, the higher the dark current and minimum detectable power but the higher the responsivity, as well. The absorption of the metal waveguide depends not only on the dimensions of the waveguide but also on the material selection. Depending on the optical parameters of the materials used, the attenuation will vary, and, hence, the absorption will vary. The absorption goes up as the attenuation goes up. Because of these conflicting design requirements on the dimensions and Schottky barrier height, it is not a simple matter to choose an appropriate material combination and associated dimensions. For this reason, design spaces for some material combinations have been generated and the best designs chosen from these are reported herein as preferred embodiments.

An example of a typical room temperature photodetector has been designed for radiation at a wavelength of 1550 nm. The photodetector comprises a cobalt disilicide-n-type silicon Schottky barrier, which has a barrier height of 0.64 eV according to S, M. Sze, *Physics of Semiconductor Devices*, $2^{nd}$ ed., Wiley, New York, 1981, p292. Using the attenuation length for photo-excited (hot) electrons in cobalt disilicide of 9 nm as determined by Duboz and Bodoz in "Hot-electron transport in epitaxial $CoSi_2$ films," Physical Review 13, Vol. 44, No. 15, 15 October 1991, the attenuation data for cobalt disilicide plasmon polariton waveguides in silicon calculated by the method described by Berini in U.S. Pat. No. 6,442,321, and using the optical constants for cobalt disilicide determined by Wu and Arakawa in "Optical properties of epitaxial $CoSi_2$/Si and $CoSi_2$ particles in Si from 0.062 to 2.76 eV," J. Appl. Phys. 71 (11), 1 Jun. 1992, appropriate device dimensions can be determined. The thickness was chosen to be 15 nm and the width was chosen to be 550 nm, at which, the attenuation of the wavegwide is 258 dB/cm. When all of the incident optical power is coupled into the waveguide, a 0.5 mm long photo detector will have a responsivity of 0.0131 A/W and a minimum detectable power of about 40 dBm. With a strong reflector at the output, the responsivity is increased to 0.0138 A/W and the minimum detectable power remains the same.

If cobalt disilicide is used on p-type silicon, the responsivity will be greatly improved. For a cobalt disilicide layer with a thickness of 20 nm and length of 0.25 mm, photodetectors have been designed for radiation at wavelengths of 1310 nm and 1550 nm. In the 1310 nm case, a waveguide with a width of 225 nm will have an attenuation of 1347 dB/cm, a responsivity of 0.1198 A/W and a minimum detectable power of-24 dBm. In the 1550 nm case, a waveguide with a width of 500 nm will have an attenuation of 792 dB/cm, a responsivity of 0.0962 A/W and a minimum detectable power of –20 dBm.

An example of a typical room temperature photodetector has been designed using aluminum for detection of radiation at a wavelength of 1310 nm. The photodetector comprises an aluminum-p-type silicon Schottky barrier, which has a barrier height of 0.58 eV according to S. M. Sze, *Physics of Semiconductor Devices*, $2^{nd}$ ed., Wiley, New York, 1981, p. 291. Assuming that the attenuation length for photo-excited holes is comparable to that of photo-excited electrons, the attenuation length for photo-excited electrons in aluminum of 100 nm as determined by Quinn in "Range of Excited Electrons in Metals," Physical Review Vol. 126, No. 4, May 15, 1962, can be used in conjunction with the attenuation data for aluminum plasmon polariton waveguides in silicon calculated by the method described by Berini in U.S. Pat. No. 6,442,321, and the optical constants for aluminum determined by E. D. Palik in *Handbook of Optical Constants of Solids*, Academic Press, Inc., Orlando, 1985, to determine appropriate device dimensions. The thickness was chosen to be 10 nm and the width was chosen to be 1 μm at which the attenuation of the waveguide is 95 dw/cm. When all of the incident optical power is coupled into the waveguide, a 2 nm long photodetector will have a responsivity of 0.0955 A/W and a minimum detectable power of about –35 dBm. The responsivity value corresponds to an external quantum efficiency of 0.0904 or 9%.

In order to achieve polarisation insensitive detection, the plasmon-polariton waveguide disclosed in International patent application No. PCT/CA 02/00971, i.e., with width and thickness of the same order of magnitude, could be used as the strip 100. With this waveguide, photo-excited carriers are emitted over the Schottkybarriers fonned at all four sides of the strip 100, i.e., at the four interfaces between the strip 100 and the surrounding semiconductor material, The theory presented in the previous section can be extended for emission over four barriers. Emission over four barriers results in inereased responsivity, albeit at the expense of increased dark current.

It will be appreciated that, depending on the desired device performance parameters, many other material combinations and device dimensions can be used to build embodiments of this invention.

Generally, however, the length is chosen such that absorption is maximized. The absorption varies with the attenuation per unit length, so the length required to maximize the absorption will vary with the attenuation of the waveguide, which itself varies with the width and thickness of the metal waveguide strip.

In the above examples, the power of the plasmon polariton mode supported by the waveguide is substantially lower than its peak value a few micrometers from the edge of the waveguide. The contact finger length, $L_f$, should be chosen such that it is in this range, i.e. about 5 µm.

It should be appreciated that, although the above-described embodiments use both strip/semiconductor interfaces as Schottky barriers, or all four in the case of the "square" waveguide strip, it would be possible to construct a photodetector using only one strip/semiconductor interface as a Schottky barrier. This would entail providing the semiconductor material on only one side of the strip with appropriate reconfiguration of the biasing contacts/electrode.

INDUSTRIAL APPLICABILITY

Embodiments of the present invention provide an alternative solution to the integration problem, having the advantage that substantially total absorption of the incident light can be achieved when designed correctly. Photodetectors according to the present invention can operate over a much broader wavelength range than the surface detectors and surface plasmon detectors discussed hereinbefore and, as compared with the endfire photodetector disclosed by Yang et al in U.S. Pat. No. 4,857,973, can achieve much higher, if not total, absorption of the incident light and provide better responsivity for a given dark current.

In embodiments of the present invention, the finite width metallic waveguide functions as the Schottky barrier photodetector, as well as the waveguide, allowing total absorption of the incident light without narrowing the bandwidth. The fact that the photodetector is an endfire excited planar device facilitates its integration with other optical and electrical devices. The use of silicon as the semiconductor improves the integration possibilities by allowing integration with CMOS, BiCMOS and Bipolar processes and electronics.

The invention claimed is:

1. A Schottky barrier photodetector means comprising a waveguide structure formed by a strip (100) of metallic material surrounded by material (112) having a relatively low free charge carrier density, optical radiation (hu) for detection being coupled to one end of the strip, the strip having finite width and thickness with dimensions such that said optical radiation couples to the strip and propagates along the length of the strip as a plasmon-polariton wave, the surrounding material on at least one side of the strip comprising doped semiconductor material, a Schottky barrier being formed between said one side of the strip and the semiconductor material, the photodetector means further comprising means (102, 103, 104, 16,108, 110) for applying bias to the Schottky barrier and extracting a current ($I_p$) in dependence upon said optical radiation.

2. A photodetector means according to claim 1, wherein the applying and extracting means comprises at least one ohmic contact (108, 110) applied to the semiconductor material and contact means (102, 103, 104, 106) connected to the strip (100).

3. A photodetector means according to claim 2, wherein said contact means comprises at least one contact (106) connected to the strip (100) by at least one connector (104) extending through the semiconductor material.

4. A photodetector means according to claim 2, wherein the semiconductor material comprises a layer adjacent the ohmic contact having a higher doping level than portions further away, thereby providing relatively reduced resistance at the connection to the ohmic contact.

5. A photodetector means according to claim 3, wherein said at least one connector (104) comprises highly-doped semiconductor material doped oppositely as compared with the surrounding semiconductor material (112).

6. A photodetector means according to claim 3, wherein the connector (104) comprises at least one core (125) of conductive material extending through a hole (126) in the surrounding material (112), the hole (126) being lined by an insulating sleeve (127) surrounding the core (125).

7. A photodetector means according to claim 3, wherein the contact means further comprises a plurality of mutually-spaced contact fingers (102) connecting the connector (104) to the strip (100).

8. A photodetector according to claim 7, wherein the contact means further comprises an elongate contact portion (103) extending substantially parallel to the waveguide strip (100) and interconnecting the contact fingers (102) and the at least one connector (104).

9. A photodetector means according to claim 1, further comprising a reflector (130) disposed at an end of the strip (100) opposite to said one end of the strip, the reflector (130) being arranged to reflect said plasmon-polariton wave back along the strip.

10. A photodetector means according to claim 9, wherein the reflector (130) comprises a grating.

11. A photodetector means according to claim 9, wherein the reflector comprises a highly reflective coating on a back facet (128) of the semiconductor material, the coating extending around an end of said strip opposite to said one end.

12. A photodetector means according to claim 10, wherein the grating comprises a second plasmon-polariton waveguide structure similar to the first-mentioned plasmon-polariton waveguide structure.

13. A photodetector means according to claim 1, wherein the material on the opposite side of the strip (100) comprises a semiconductor material, thereby providing a second Schottky barrier at the interface therebetween.

14. A photodetector means according to claim 1, wherein the material on all four sides of the strip (100) comprises semiconductor material, such that there are four Schottky barrier interfaces between the four sides of the strip and the semiconductor material.

15. A photodetector means according to claim 1, wherein the strip has width and thickness of the same order of magnitude.

16. A photodetector means according to claim 1, wherein the semiconductor material comprises silicon and the strip material comprises a metal silicide.

17. A photodetector means according to claim 1, wherein the metal silicide is selected from the group consisting of platinum-based silicides, palladium-based silicides, erbium-based silicides, iridium-based silicides, cobalt-based silicides, titanium-based silicides and nickel-based silicides.

18. A photodetector means according to claim 1, wherein the semiconductor material comprises germanium and the strip material comprises a metal germanide.

19. A photodetector means according to claim 18, wherein the germanide is selected from the group consisting of platinum-based germanides, palladium-based germanides, cobalt-based germanides and titanium-based germanides.

20. A photodetector means according to claim 1, wherein the semiconductor material comprises silicon-germanium and the strip material comprises a combination of a metal silicide and a metal germanide.

21. A photodetector means according to claim 1, wherein the strip comprises a single material or a combination of materials selected from the group consisting of metals, semi-metals and materials which behave like metals.

22. A photodetector means according to claim 21, wherein the strip comprises a metal selected from the group consisting of gold, copper, aluminum, silver, platinum, palladium, nickel, titanium, tungsten, molybdenum and chromium.

23. A photodetector according to claim 21, wherein the strip comprises Indium Tin Oxide (ITO).

24. A photodetector means according to claim 21, wherein the surrounding material is inhomogeneous.

25. A photocletector means according to claim 24, wherein the surrounding material comprises a continuously variable material composition or a combination of slabs and/or strips and/or laminae.

26. A photodetector means according to claim 21, wherein the strip is inbomogeneous.

27. A photodetector means according to claim 26, wherein the strip comprises layers of different metallic materials.

28. A photodetector according to claim 1, wherein the semiconductor material comprises an elemental semiconductor material formed from elements of Column IV of the Mendeleev periodic table, or a compound semiconductor formed from elements of Column IV of the Mendeleev periodic table, or a compound semiconductor material formed from elements of Columns III and V of the Mendeleev periodic table, or a compound semiconductor material formed from elements of Columns II and VI of the Mendeleev periodic table.

29. A photodetector according to claim 28, wherein the semiconductor material is selected from the group consisting of silicon, germanium, silicon-germanium, silicon carbide, silicon germanium carbide, silicon germanium carbide tin, gallium arsenide, indium phosphide, gallium aluminum phosphide, gallium aluminum arsenide, gallium indium phosphide, gallium indium arsenide, gallium indium aluminum phosphide, gallium indium aluminum arsenide, gallium indium arsenide phosphide, and gallium aluminum arsenide phosphide.

30. A photodetector according to claim 1, wherein the semiconductor material has a thin layer adjacent said side of the strip that is doped to a higher level than portions further away from the strip, the thickness and doping level of the layer being preselected to provide a desired Schottky barrier height.

* * * * *